(12) United States Patent
Liu et al.

(10) Patent No.: US 9,887,216 B2
(45) Date of Patent: Feb. 6, 2018

(54) METHODS FOR MANUFACTURING POLY-SILICON THIN FILM TRANSISTOR AND ARRAY SUBSTRATE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Tianzhen Liu, Beijing (CN); Chengcheng Wang, Beijing (CN); Xianxue Duan, Beijing (CN)

(73) Assignees: BOE TECHNOLOGY GROUP CO., LTD. (CN); HEFEI BOE OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 15/151,014

(22) Filed: May 10, 2016

(65) Prior Publication Data

US 2016/0351603 A1    Dec. 1, 2016

(30) Foreign Application Priority Data

Jun. 1, 2015    (CN) .......................... 2015 1 0297435

(51) Int. Cl.
*H01L 21/02*    (2006.01)
*H01L 27/12*    (2006.01)
(Continued)

(52) U.S. Cl.
CPC ........ *H01L 27/1285* (2013.01); *H01L 29/458* (2013.01); *H01L 29/6675* (2013.01)

(58) Field of Classification Search
CPC ........... H01L 21/02667; H01L 21/2022; H01L 27/1214; H01L 29/6675; H01L 29/78672; H01L 31/1872
See application file for complete search history.

(56) References Cited

U.S. PATENT DOCUMENTS

| 6,297,080 B1 * | 10/2001 | Lee ....................... G02F 1/1368 |
| | | 257/55 |
| 7,960,220 B2 * | 6/2011 | Choi ................. H01L 29/42384 |
| | | 257/E21.133 |

(Continued)

FOREIGN PATENT DOCUMENTS

| CN | 101320685 A | 12/2008 |
| CN | 101937144 A | 1/2011 |

(Continued)

OTHER PUBLICATIONS

First Office Action for Chinese Application No. 201510297435.1, dated Jul. 4, 2017, 6 Pages.

*Primary Examiner* — Jaehwan Oh
(74) *Attorney, Agent, or Firm* — Brooks Kushman P.C.

(57) ABSTRACT

The present disclosure provides a poly-silicon TFT, its manufacturing method, an array substrate and its manufacturing method. The method for manufacturing the poly-silicon TFT includes a step of, subsequent to the formation of an amorphous-silicon active layer and a source electrode of the TFT, applying an electrical signal to the source electrode, so as to maintain the source electrode at a predetermined temperature for a predetermined time period, thereby to crystallize the amorphous active layer into a poly-silicon active layer due to heat generated by the source electrode and transferred to the amorphous active layer.

3 Claims, 3 Drawing Sheets

(51) Int. Cl.
*H01L 29/66* (2006.01)
*H01L 29/45* (2006.01)

(56) References Cited

U.S. PATENT DOCUMENTS

| | | | |
|---|---|---|---|
| 2008/0164475 A1 | 7/2008 | Choi et al. | |
| 2009/0223557 A1* | 9/2009 | Park | H01L 31/022425 136/255 |
| 2010/0330718 A1* | 12/2010 | Lee | G02F 1/136227 438/30 |
| 2012/0080684 A1* | 4/2012 | You | H01L 29/66765 257/72 |
| 2013/0001580 A1* | 1/2013 | Son | H01L 29/66757 257/72 |

FOREIGN PATENT DOCUMENTS

| | | |
|---|---|---|
| CN | 102446975 A | 5/2012 |
| CN | 102465338 A | 5/2012 |
| CN | 102856388 A | 1/2013 |

* cited by examiner

_US 9,887,216 B2_

METHODS FOR MANUFACTURING POLY-SILICON THIN FILM TRANSISTOR AND ARRAY SUBSTRATE

CROSS-REFERENCE TO RELATED APPLICATION

The present application claims a priority of the Chinese Patent Application No. 201510297435.1 filed on Jun. 1, 2015, which is incorporated herein by reference in its entirety.

TECHNICAL FIELD

The present disclosure relates to the field of display technology, in particular to a poly-silicon thin film transistor, its manufacturing method, an array substrate and its manufacturing method.

BACKGROUND

A low temperature poly-silicon thin film transistor (LTPS TFT) has such advantages as high resolution, rapid response, high brightness, large aperture ratio and high electron mobility.

Currently, the LTPS TFT includes, on a base substrate, an active layer, a gate insulation layer, a gate electrode, a source electrode and a drain electrode. The active layer is made of poly-silicon. An important technique for manufacturing the LTPS TFT includes crystallization methods for converting amorphous-silicon into poly-silicon. The methods may include a non-laser crystallization method and a laser annealing method. In the non-laser crystallization method, the easiest way is to perform solid-phase crystallization (SPC). However, for the SPC, an annealing step needs to be carried out at a temperature of 600° C. for about 10 hours, so it is not suitable for a large-size glass substrate. In the laser annealing method, the most common way is to perform excimer laser annealing (ELA). However, an ELA device is very expensive, so the production cost of the LTPS TFT will be increased.

SUMMARY

An object of the present disclosure is to provide a poly-silicon TFT, its manufacturing method, an array substrate and its manufacturing method, so as to crystallize amorphous-silicon into poly-silicon using heat generated by an electrical signal, thereby to simplify a manufacture process and reduce the production cost.

In one aspect, the present disclosure provides in some embodiments a method for manufacturing a poly-silicon TFT, including a step of, subsequent to the formation of an amorphous-silicon active layer and a source electrode of the TFT, applying an electrical signal to the source electrode, so as to maintain the source electrode at a predetermined temperature for a predetermined time period, thereby to crystallize the amorphous active layer into a poly-silicon active layer due to heat generated by the source electrode and transferred to the amorphous active layer.

Alternatively, the electrical signal is a pulse signal.

Alternatively, the predetermined temperature is 800 to 1000° C., and the predetermined time period is 20 to 40 minutes.

In another aspect, the present disclosure provides in some embodiments a poly-silicon TFT manufactured by the above-mentioned method.

In yet another aspect, the present disclosure provides in some embodiments a method for manufacturing a poly-silicon TFT array substrate, including a step of, subsequent to the formation of an amorphous-silicon active layer, a source electrode and a data line on the array substrate, applying an electrical signal to the data line and the source electrode, so as to maintain the source electrode and the data line at a predetermined temperature for a predetermined time period, thereby to crystallize the amorphous-silicon active layer into a poly-silicon active layer due to heat generated by the data line and the source electrode and transferred to the amorphous-silicon active layer.

Alternatively, the method further includes forming a first signal input node connected to the data line on the array substrate while forming the source electrode and the data line, and inputting the electrical signal to the first signal input node, so as to apply the electrical signal to the data line on the array substrate.

Alternatively, the method further includes forming a second signal input node electrically connected to the first signal input node via a wire while forming the first signal input node, and inputting the electrical signal to the second signal input node, so as to input the electrical signal to the first signal input node, thereby to apply the electrical signal to the data line on the array substrate. The wire is arranged at a periphery of the array substrate and has a length greater than a predetermined length.

Alternatively, the wire makes a circle around the array substrate.

Alternatively, the electrical signal is a pulse signal.

Alternatively, the predetermined temperature is 800 to 1000° C., and the predetermined time period is 20 to 40 minutes.

In still yet another aspect, the present disclosure provides in some embodiments a poly-silicon TFT array substrate manufactured by the above-mentioned method.

According to the embodiments of the present disclosure, subsequent to the formation of the amorphous-silicon active layer and the source electrode of the TFT, the electrical signal is applied to the source electrode. Due to a resistance of the source electrode, heat may be generated by the source electrode under the effect of the electrical signal. The heat is transferred from the source electrode to the amorphous-silicon active layer, so as to crystallize the amorphous-silicon active layer into the poly-silicon active layer. In addition, due to the gate insulation layer arranged under the amorphous-silicon active layer, it is able to prevent the glass substrate from being adversely affected by the heat. As a result, it is able to simplify a process for manufacturing the poly-silicon TFT and reduce the production cost, thereby to facilitate the mass production of the poly-silicon TFT.

DETAILED DESCRIPTION OF THE EMBODIMENTS

The present disclosure will be described hereinafter in conjunction with the drawings and embodiments. The following embodiments are for illustrative purposes only, but shall not be used to limit the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In the related art, in the case of crystallizing amorphous-silicon into poly-silicon, a non-laser crystallization method is not suitable for a large-size glass substrate, and an ELA device is expensive. In this regard, the present disclosure provides in some embodiments a poly-silicon TFT, its manufacturing method, an array substrate and its manufacturing method, so as to crystallize amorphous-silicon into poly-silicon using heat generated by an electrical signal, thereby to simplify a manufacture process and reduce the production cost.

Figure 3:
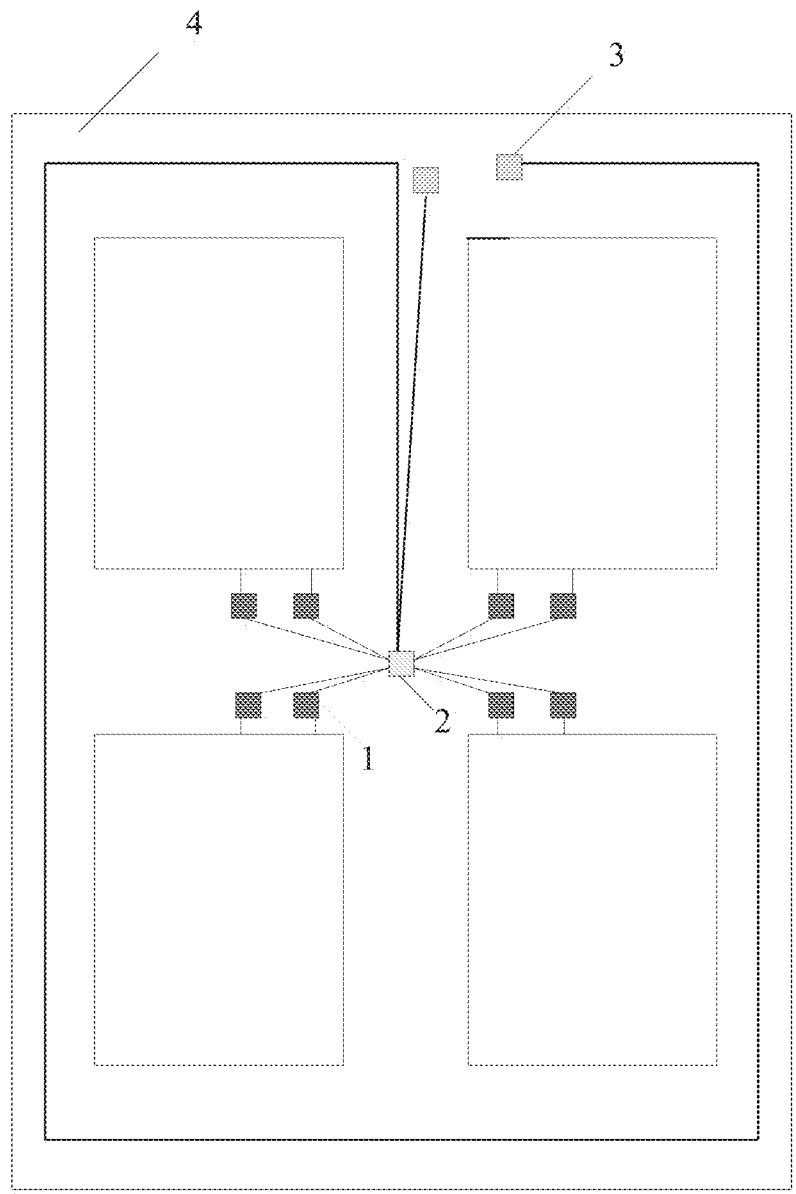
FIG. 3 is yet another schematic view showing the wiring mode for the array substrate according to one embodiment of the present disclosure.

The present disclosure provides in some embodiments a method for manufacturing a poly-silicon TFT, including a step of, subsequent to the formation of an amorphous-silicon active layer and a source electrode of the TFT applying an electrical signal to the source electrode, so as to maintain the source electrode at a predetermined temperature for a predetermined time period, thereby to crystallize the amorphous active layer into a poly-silicon active layer due to heat generated by the source electrode and transferred to the amorphous active layer. In the embodiments of the present disclosure, the loop for applying the electrical signal to the source electrode is not particularly defined herein, as long as the objects of the present disclosure may be achieved. For example, it should be appreciated that, a liquid crystal display (LCD) may include a dedicated ground (GND) line, and the other lines may be connected to the GND to form the loop, as shown in FIG. 3.

According to the embodiments of the present disclosure, subsequent to the formation of the amorphous-silicon active layer and the source electrode of the TFT, the electrical signal is applied to the source electrode. Due to a resistance of the source electrode, heat may be generated by the source electrode under the effect of the electrical signal. The heat is transferred from the source electrode to the amorphous-silicon active layer, so as to crystallize the amorphous-silicon active layer into the poly-silicon active layer. In addition, due to the gate insulation layer arranged under the amorphous-silicon active layer, it is able to prevent the glass substrate from being adversely affected by the heat. As a result, it is able to simplify a process for manufacturing the poly-silicon TFT, reduce the production cost, and facilitate the mass production of the poly-silicon TFT.

To be specific, the electrical signal applied to the source electrode is a pulse signal, so as to maintain the source electrode at a predetermined temperature.

Alternatively, the electrical signal is applied to the source electrode, so as to maintain the source electrode at a temperature of 800 to 1000° C. for 20 to 40 minutes. In this way, sufficient heat may be generated to crystallize the amorphous-silicon active layer into the poly-silicon active layer, and meanwhile it is able to prevent the generation of excessive heat.

The present disclosure further provides in some embodiments a poly-silicon TFT manufactured by the above-mentioned method.

The present disclosure further provides in some embodiments a method for manufacturing a poly-silicon TFT array substrate, including a step of, subsequent to the formation of an amorphous-silicon active layer, a source electrode and a data line on the array substrate, applying an electrical signal to the data line and the source electrode, so as to maintain the source electrode and the data line at a predetermined temperature for a predetermined time period, thereby to crystallize the amorphous-silicon active layer into a poly-silicon active layer due to heat generated by the data line and the source electrode and transferred to the amorphous-silicon active layer.

Prior to the step of forming the amorphous-silicon active layer, the source electrode and the data line on the array substrate, the method further includes the following steps.

Step S11: providing a base substrate. To be specific, the base substrate may be a glass substrate or quartz substrate.

Step S12: depositing a gate metal layer onto the base substrate, and forming patterns of a gate electrode and a gate line by a single patterning process. To be specific, the gate metal layer having a thickness of 2500 to 16000 Å may be deposited onto the base substrate by sputtering or thermal evaporation. The gate metal layer may be made of Cu, Mo, Cr, Nd, Ni, Mn, Ti, W or an alloy thereof, and it may be of a single-layered structure, or a multi-layered structure such as Cu/Mo or Ti/Cu/Ti. A photoresist may be applied onto the gate metal layer, and then exposed with a mask plate, so as to form a photoresist reserved region corresponding to a region where the patterns of the gate electrode and the gate line are located, and a photoresist unreserved region corresponding to the other regions. Next, the photoresist may be developed, so as to fully remove the photoresist at the photoresist unreserved region and maintain a thickness of the photoresist at the photoresist reserved region. Then, the gate metal layer at the photoresist unreserved region may be fully etched off, and the remaining photoresist may be removed, so as to form the patterns of the gate electrode and the gate line.

Step S13: forming a gate insulation layer. To be specific, the gate insulation layer having a thickness of about 2000 to 6000 Å may be deposited onto the base substrate with the gate electrode and the gate line by plasma enhanced chemical vapor deposition (PECVD). The gate insulation layer may be made of an oxide, a nitride or an oxynitride, and it may be of a single-layered, double-layered or multi-layered structure. Specifically, the gate insulation layer may be made of $SiN_x$, $SiO_x$ or $Si(ON)_x$.

Then, the step of forming the amorphous-silicon active layer, the source electrode and the data line may include the following steps.

Step S14: forming a pattern of the amorphous-silicon active layer. To be specific, an amorphous-silicon layer having a thickness of about 20 to 1000 Å may be deposited onto the gate insulation layer by magnetron sputtering, thermal evaporation or any other film-forming method. Next, a photoresist may be applied onto the amorphous-silicon layer, and then exposed and developed. Then, the amorphous-silicon layer may be etched and the remaining photoresist may be removed, so as to form the pattern of the amorphous-silicon active layer.

Figure 1:
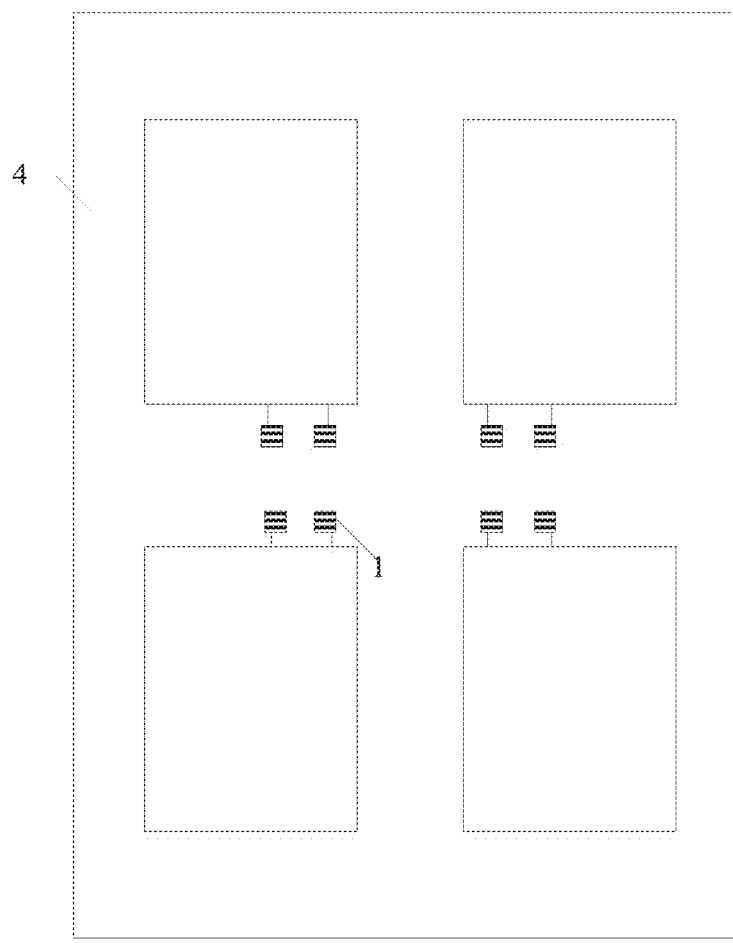
FIG. 1 is a schematic view showing a wiring mode for an array substrate according to one embodiment of the present disclosure.

Step S15: forming patterns of the data line, the source electrode and a drain electrode. To be specific, a source/drain metal layer having a thickness of about 2000 to 6000 Å may be deposited onto the base substrate with the amorphous-silicon active layer by magnetron sputtering, thermal evaporation or any other film-forming method. The source/drain metal layer may be made of Cu, Mo, Cr, Nd, Ni, Mn, Ti, W, or an alloy thereof, and it may be of a single-layered structure, or a multi-layered structure such as Cu/Mo or Ti/Cu/Ti. A photoresist may be applied onto the source/drain metal layer, and then exposed with a mask plate, so as to form a photoresist reserved region corresponding to a region where the patterns of the data line, the source electrode and the drain electrode are located, and a photoresist unreserved region corresponding to the other regions. Next, the photoresist may be developed, so as to fully remove the photoresist at the photoresist unreserved region and maintain a thickness of the photoresist at the photoresist reserved region. Then, the source/drain metal layer at the photoresist unreserved region may be fully etched off, and the remaining photoresist may be removed, so as to form the patterns of the data line, the source electrode and the drain electrode. The source electrode, the drain electrode and the gate electrode form the TFT, as shown in FIG. 1. The data line includes an input terminal 1, through which a signal may be inputted to the data line on the array substrate 4 and thereby applied to the source electrode.

According to the embodiments of the present disclosure, subsequent to the formation of the source electrode, the drain electrode and the data line, the strong electrical signal is applied to the data line and the source electrode via the input terminal 1 of the data line. Due to resistances of the source electrode and the data line, heat may be generated by the source electrode and the data line under the effect of the electrical signal. The heat is transferred to the amorphous-silicon active layer, so as to crystallize the amorphous-silicon active layer into the poly-silicon active layer. In addition, due to the gate insulation layer arranged under the amorphous-silicon active layer, it is able to prevent the glass substrate from being adversely affected by the heat. As a result, through the strong electric current and the thermal effect at the large resistance, it is able to generate sufficient heat to crystallize amorphous-silicon into poly-silicon, thereby to simplify a process for manufacturing the poly-silicon TFT, reduce the production cost, and facilitate the mass production of the poly-silicon TFT To be specific, the electrical signal applied to the data line is a pulse signal, so as to maintain the data line and the source electrode at a predetermined temperature.

Alternatively, the electric signal may be applied to the data line, so as to maintain the data line and the source electrode at a temperature of 800 to 1000° C. for to about 20 to 40 minutes. In this way, sufficient heat may be generated to crystallize the amorphous-silicon active layer into the poly-silicon active layer, and meanwhile, it is able to prevent the generation of excessive heat.

Figure 2:
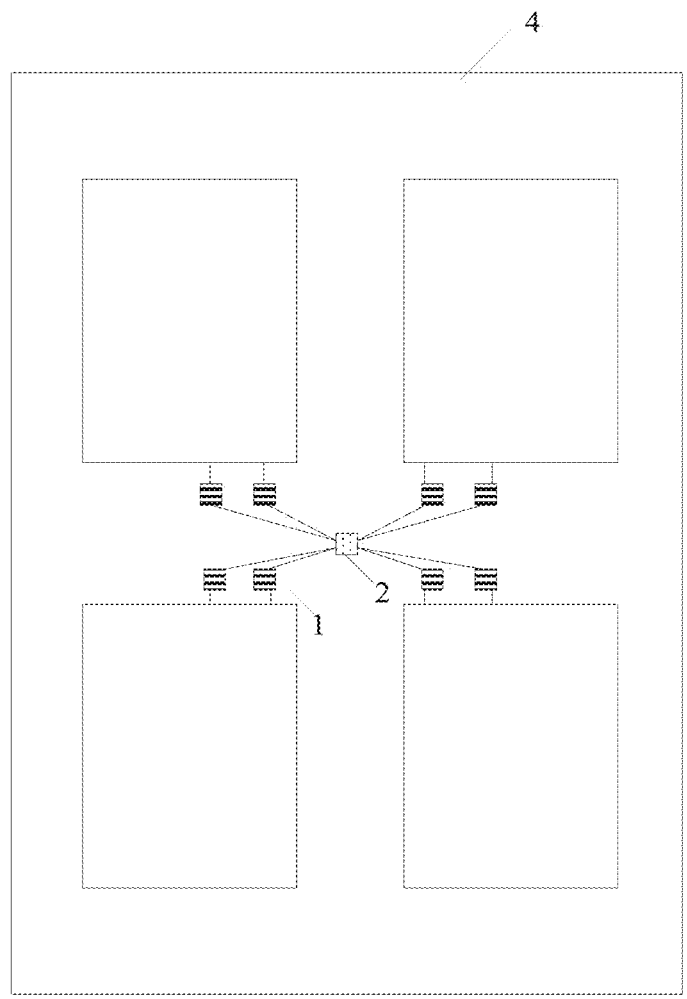
FIG. 2 is another schematic view showing the wiring mode for the array substrate according to one embodiment of the present disclosure.

The present disclosure further provides in some embodiments a method for manufacturing a poly-silicon TFT array substrate, which, as shown in FIG. 2, includes steps of forming a first signal input node 2 capable of applying an electric signal to the input terminal 1 of the data line on the array substrate 4 while forming the amorphous-silicon active layer, the source electrode and the data line on the array substrate, and applying a strong electric signal to the input terminal 1 of the data line via the first signal input node 2, so as to maintain the source electrode and the data line at a predetermined temperature for a predetermined time period, thereby to crystallize the amorphous-silicon active layer into a poly-silicon active layer due to heat generated by the source electrode and the drain electrode and transferred to the amorphous-silicon active layer.

Prior to the step of forming the amorphous-silicon active layer, the source electrode, the data line and the first signal input node, the method further includes the following steps.

Step S21: providing a base substrate. To be specific, the base substrate may be a glass substrate or quartz substrate.

Step S22: depositing a gate metal layer onto the base substrate, and forming patterns of a gate electrode and a gate line by a single patterning process. To be specific, the gate metal layer having a thickness of 2500 to 16000 Å may be deposited onto the base substrate by sputtering or thermal evaporation. The gate metal layer may be made of Cu, Mo, Cr, Nd, Ni, Mn, Ti, W or an alloy thereof, and it may be of a single-layered structure, or a multi-layered structure such as Cu/Mo or Ti/Cu/Ti. A photoresist may be applied onto the gate metal layer, and then exposed with a mask plate, so as to form a photoresist reserved region corresponding to a region where the patterns of the gate electrode and the gate line are located, and a photoresist unreserved region corresponding to the other regions. Next, the photoresist may be developed, so as to fully remove the photoresist at the photoresist unreserved region and maintain a thickness of the photoresist at the photoresist reserved region. Then, the gate metal layer at the photoresist unreserved region may be fully etched off, and the remaining photoresist may be removed, so as to form the patterns of the gate electrode and the gate line.

Step S23: forming a gate insulation layer. To be specific, the gate insulation layer having a thickness of about 2000 to 6000 Å may be deposited onto the base substrate with the gate electrode and the gate line by plasma enhanced chemical vapor deposition (PECVD). The gate insulation layer may be made of an oxide, a nitride or an oxynitride, and it may be of a single-layered, double-layered or multi-layered structure. Specifically, the gate insulation layer may be made of $SiN_x$, $SiO_x$ or $Si(ON)_x$.

Then, the step of forming the amorphous-silicon active layer, the source electrode, the data line and the first signal input node may include the following steps.

Step S24: forming a pattern of the amorphous-silicon active layer. To be specific, an amorphous-silicon layer having a thickness of about 20 to 1000 Å may be deposited onto the gate insulation layer by magnetron sputtering, thermal evaporation or any other film-forming method. Next, a photoresist may be applied onto the amorphous-silicon layer, and then exposed and developed. Then, the amorphous-silicon layer may be etched and the remaining photoresist may be removed, so as to form the pattern of the amorphous-silicon active layer.

Step S25: forming patterns of the data line, the source electrode, the drain electrode and the first signal input node. To be specific, a source/drain metal layer having a thickness of about 2000 to 6000 Å may be deposited onto the base substrate with the amorphous-silicon active layer by magnetron sputtering, thermal evaporation or any other film-forming method. The source/drain metal layer may be made of Cu, Mo, Cr, Nd, Ni, Mn, Ti, W, or an alloy thereof, and it may be of a single-layered structure, or a multi-layered structure such as Cu/Mo or Ti/Cu/Ti. A photoresist may be applied onto the source/drain metal layer, and then exposed with a mask plate, so as to form a photoresist reserved region corresponding to a region where the patterns of the data line, the source electrode, the drain electrode and the first signal input node are located, and a photoresist unreserved region corresponding to the other regions. Next, the photoresist may be developed, so as to fully remove the photoresist at the photoresist unreserved region and maintain a thickness of the photoresist at the photoresist reserved region. Then, the source/drain metal layer at the photoresist unreserved region may be fully etched off, and the remaining photoresist may be removed, so as to form the patterns of the data line, the source electrode, the drain electrode and the first signal input node 2. The source electrode, the drain electrode and the gate electrode form the TFT, as shown in FIG. 2. The data line includes the input terminal 1, through which a signal may be inputted to the data line on the array substrate 4 and thereby applied to the source electrode. The first signal input node 2 is electrically connected to the input terminal 1 of the data line on the array substrate 4.

According to the embodiments of the present disclosure, subsequent to the formation of the source electrode, the drain electrode and the data line, the strong electrical signal is inputted to the first signal input node 2, so as to apply the electrical signal to the data line and the source electrode via the input terminal 1 of the data line. Due to resistances of the source electrode and the data line, heat may be generated by the source electrode and the data line under the effect of the electrical signal. The heat is transferred to the amorphous-silicon active layer, so as to crystallize the amorphous-silicon active layer into the poly-silicon active layer. In addition, due to the gate insulation layer arranged under the amorphous-silicon active layer, it is able to prevent the glass substrate from being adversely affected by the heat. As a result, through the strong electric current and the thermal effect at the large resistance, it is able to generate sufficient heat to crystallize amorphous-silicon into poly-silicon, thereby to simplify a process for manufacturing the poly-silicon TFT, reduce the production cost, and facilitate the mass production of the poly-silicon TFT.

To be specific, the electrical signal inputted to the first signal input node 2 is a pulse signal, so as to maintain the data line and the source electrode at a predetermined temperature.

Alternatively, the electrical signal inputted to the first signal input node 2 needs to be capable of maintaining the data line and the source electrode at a temperature of 800 to 1000° C. for 20 to 40 minutes. In this way, sufficient heat may be generated to crystallize the amorphous-silicon active layer into the poly-silicon active layer, and meanwhile, it is able to prevent the generation of excessive heat.

A resistance of a conductor is in direct proportion to its length, and in the case that the other parameters are constant, the longer the conductor, the larger its resistance. In addition, in the case that an electric current is constant, the resistance of the conductor is in direct proportion to heat generated thereby. The larger the resistance of the conductor, the more the heat generated thereby. In order to enable the data line and the source electrode to generate sufficient heat, as shown in FIG. 3, the method further includes forming the first signal input node 2 capable of applying the electrical signal to the input terminal 1 of the data line on the array substrate 4 and a second signal input node 3 electrically connected to the first signal input node 2 via a wire, while forming the amorphous-silicon active layer, the source electrode and the data line. The wire is of a length greater than a predetermined length, so as to provide a sufficient large resistance, thereby to generate sufficient heat in the case that a large electric current is applied thereto and transfer the heat to the data line and the source electrode. Alternatively, the wire is arranged at a periphery of the array substrate. In this way, after the cell formation, the periphery of the array substrate may be cut off, so as to remove the wire, thereby to prevent the subsequent process from being adversely affected. For a six-generation production line, the array substrate has a size of 1850*1500 mm, and the wire may make a circle around the array substrate.

Then, a strong electrical signal may be inputted to the second signal input node 3, so as to input it to the first signal input node 2 and thereby to the data line on the array substrate 4. In this way, it is able to maintain the source electrode and the data line at the predetermined temperature for the predetermined time period, thereby to crystallize the amorphous-silicon active layer into the poly-silicon active layer due to the heated generated by the data line and the source electrode and transferred to the amorphous-silicon active layer.

Prior to the step of forming the amorphous-silicon active layer, the source electrode, the data line, the first signal input node and the second signal input end, the method may further include the following steps.

Step S31: providing a base substrate. To be specific, the base substrate may be a glass substrate or quartz substrate.

Step S32: depositing a gate metal layer onto the base substrate, and forming patterns of a gate electrode and a gate line by a single patterning process. To be specific, the gate metal layer having a thickness of 2500 to 16000 Å may be deposited onto the base substrate by sputtering or thermal evaporation. The gate metal layer may be made of Cu, Mo, Cr. Nd, Ni. Mn, Ti, W or an alloy thereof, and it may be of a single-layered structure, or a multi-layered structure such as Cu/Mo or Ti/Cu/Ti. A photoresist may be applied onto the gate metal layer, and then exposed with a mask plate, so as to form a photoresist reserved region corresponding to a region where the patterns of the gate electrode and the gate line are located, and a photoresist unreserved region corresponding to the other regions. Next, the photoresist may be developed, so as to fully remove the photoresist at the photoresist unreserved region and maintain a thickness of the photoresist at the photoresist reserved region. Then, the gate metal layer at the photoresist unreserved region may be fully etched off, and the remaining photoresist may be removed, so as to form the patterns of the gate electrode and the gate line.

Step S33: forming a gate insulation layer. To be specific, the gate insulation layer having a thickness of about 2000 to 6000 Å may be deposited onto the base substrate with the gate electrode and the gate line by PECVD. The gate insulation layer may be made of an oxide, a nitride or an oxynitride, and it may be of a single-layered, double-layered or multi-layered structure. Specifically, the gate insulation layer may be made of SiNx, SiOx or Si(ON)x.

Then, the step of forming the amorphous-silicon active layer, the source electrode, the data line, the first signal input node and the second signal input node may include the following steps.

Step S34: forming a pattern of the amorphous-silicon active layer. To be specific, an amorphous-silicon layer having a thickness of about 20 to 1000 Å may be deposited onto the gate insulation layer by magnetron sputtering, thermal evaporation or any other film-forming method. Next, a photoresist may be applied onto the amorphous-silicon layer, and then exposed and developed. Then, the amorphous-silicon layer may be etched and the remaining photoresist may be removed, so as to form the pattern of the amorphous-silicon active layer.

Step S35: forming patterns of the data line, the source electrode, the drain electrode, the first signal input node and the second signal input node. To be specific, a source/drain metal layer having a thickness of about 2000 to 6000 Å may be deposited onto the base substrate with the amorphous-silicon active layer by magnetron sputtering, thermal evaporation or any other film-forming method. The source/drain metal layer may be made of Cu, Mo, Cr, Nd, Ni, Mn, Ti, W, or an alloy thereof, and it may be of a single-layered structure, or a multi-layered structure such as Cu/Mo or Ti/Cu/Ti. A photoresist may be applied onto the source/drain metal layer, and then exposed with a mask plate, so as to form a photoresist reserved region corresponding to a region where the patterns of the data line, the source electrode, the drain electrode and the first signal input node are located, and a photoresist unreserved region corresponding to the other regions. Next, the photoresist may be developed, so as to fully remove the photoresist at the photoresist unreserved region and maintain a thickness of the photoresist at the photoresist reserved region. Then, the source/drain metal layer at the photoresist unreserved region may be fully etched off, and the remaining photoresist may be removed, so as to form the patterns of the data line, the source electrode, the drain electrode, the first signal input node 2, the wire, and the second signal input node 3. The source electrode, the drain electrode and the gate electrode form the TFT, as shown in FIG. 3. The data line includes the input terminal 1, through which a signal may be inputted to the data line on the array substrate 4 and thereby applied to the source electrode.

According to the embodiments of the present disclosure, subsequent to the formation of the source electrode, the drain electrode and the data line, the strong electrical signal is inputted to the second signal input node 3, so as to apply the electrical signal to the data line and the source electrode via the wire, the first signal input node 2 and the input terminal 1 of the data line. Due to resistances of the source electrode and the data line, heat may be generated by the source electrode and the data line under the effect of the electrical signal. The heat is transferred to the amorphous-silicon active layer, so as to crystallize the amorphous-silicon active layer into the poly-silicon active layer. In addition, due to the gate insulation layer arranged under the amorphous-silicon active layer, it is able to prevent the glass substrate from being adversely affected by the heat. As a result, through the strong electric current and the thermal effect at the large resistance, it is able to generate sufficient heat to crystallize amorphous-silicon into poly-silicon, thereby to simplify a process for manufacturing the poly-silicon TFT, reduce the production cost, and facilitate the mass production of the poly-silicon TFT To be specific, the electrical signal inputted to the second signal input node 3 is a pulse signal, so as to maintain the wire, the data line and the source electrode at a predetermined temperature.

Alternatively, the electrical signal inputted to the second signal input node 3 needs to be capable of maintaining the wire, the data line and the source electrode at a temperature of 800 to 1000° C. for 20 to 40 minutes. In this way, sufficient heat may be generated to crystallize the amorphous-silicon active layer into the poly-silicon active layer, and meanwhile, it is able to prevent the generation of excessive heat.

The present disclosure further provides in some embodiments a poly-silicon TFT array substrate manufactured by the above-mentioned method.

The present disclosure further provides in some embodiments a mother plate for manufacturing a poly-silicon TFT array substrate, including: a plurality of TFTs each having an amorphous-silicon active layer and a plurality of data lines, a first signal input node connected to the data lines, and a second signal input node electrically connected to the first signal input node via a wire. The wire is arranged at a periphery of the array substrate and has a length greater than a predetermined length.

The wire needs to have a length greater than the predetermined length, so as to provide a sufficient large resistance, thereby to generate sufficient heat in the case that a large electric current is applied thereto and transfer the heat to the data line and the source electrode. In the case that the wire is arranged at the periphery of the array substrate, after the cell formation, the periphery of the array substrate may be cut off, so as to remove the wire, thereby to prevent the subsequent process from being adversely affected. For a six-generation production line, the array substrate has a size of 1850*1500 mm, and the wire may make a circle around the array substrate.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A method for manufacturing a poly-silicon thin film transistor (TFT) array substrate, comprising:
   subsequent to the formation of an amorphous-silicon active layer, a source electrode and a data line on the array substrate, applying an electrical signal to the data line and the source electrode, maintaining the source electrode and the data line at a predetermined temperature for a predetermined time period, and crystallizing the amorphous-silicon active layer into a poly-silicon active layer due to heat generated by the data line and the source electrode and transferred to the amorphous-silicon active layer, and
   forming a first signal input node connected to the data line on the array substrate while forming the source electrode and the data line, and inputting the electrical signal to the first signal input node, to apply the electrical signal to the data line on the array substrate,
   forming a second signal input node electrically connected to the first signal input node via a wire while forming the first signal input node, and inputting the electrical signal to the second signal input node to input the electrical signal to the first signal input node, thereby to apply the electrical signal to the data line on the array substrate, wherein the wire is arranged at a periphery of the array substrate and has a length greater than a predetermined length, the wire makes a circle around the array substrate, and
   cutting off the periphery of the array substrate after cell formation to remove the wire.

2. The method according to claim 1, wherein the electrical signal is a pulse signal.

3. The method according to claim 1, wherein the predetermined temperature is 800 to 1000° C., and the predetermined time period is 20 to 40 minutes.

* * * * *